Dec. 3, 1968 E. J. DIEBOLD 3,414,780

HIGH VOLTAGE SEMICONDUCTOR DEVICE WITH ELECTRICAL GRADIENT-REDUCING GROOVE

Filed Jan. 6, 1966

INVENTOR.
EDWARD J. DIEBOLD

BY

OSTROLENK, FABER, GERB & SOFFEN

ATTORNEYS

United States Patent Office 3,414,780
Patented Dec. 3, 1968

3,414,780
HIGH VOLTAGE SEMICONDUCTOR DEVICE WITH ELECTRICAL GRADIENT-REDUCING GROOVE

Edward J. Diebold, Palos Verdes Estates, Calif., assignor to International Rectifier Corporation, El Segundo, Calif., a corporation of California Filed Jan. 6, 1966, Ser. No. 519,036
8 Claims. (Cl. 317—234)

ABSTRACT OF THE DISCLOSURE

A high voltage semiconductor wafer having at least one region of P-type conductivity and one region of N-type conductivity is provided with a groove in one of said regions adjacent the periphery of the wafer. The groove extends into the region to a depth where the concentration of the dopants of that region are almost zero. The width of the groove is of the order of five to ten times its depth. Since the lateral conductivity of the wafer is very poor and since the groove is substantially wider than the thickness of the wafer, the electrical gradient in the groove will be low and spread out while the electrical gradient on the outer rim will be also low since the voltage will not reach laterally outwardly to this outer rim portion.

This invention relates to a novel semiconductor device construction, and more particularly relates to a novel arrangement of a groove closely spaced to the outer periphery of a wafer surface to decrease the electrical gradient around the outer rim of semiconductor devices.

Semiconductor devices when used for high voltage applications frequently fail around the outer edges thereof because of a high electrical gradient on the outer rim of the devices.

The principle of the present invention is to provide a novel groove around the outer periphery of a junction which is cut into the surface of the wafer containing the junction and falls just short of the junction itself. Thus, the groove cutting will not damage the junction zone, while it physically separates the rim portion of the wafer from the anode electrode. That is, the lateral conductivity of silicon wafers is very poor and current conduction, in accordance with the invention, is taken from the anode electrode to the rim of the wafer through lightly doped portions of the wafer. Thus, when the anode is made strongly positive, the rim will not be charged up and substantially the entire potential difference will appear along the bottom of the flat groove interposed between the anode and the wafer rim. The electrical gradient in the groove, however, will be low and radically spread out, while the electrical gradient on the outer rim will also be low, since the voltage will not reach laterally outwardly to this outer rim portion.

Accordingly, a primary object of this invention is to provide a novel construction for semiconductor wafers having junctions therein which can be used in high voltage applications.

Another object of this invention is to reduce the electrical gradient at the outer rim of a semiconductor wafer having a junction therein.

These and other objects of this invention will become apparent from the following description when taken in connection with the drawings, in which.

Figure 1:
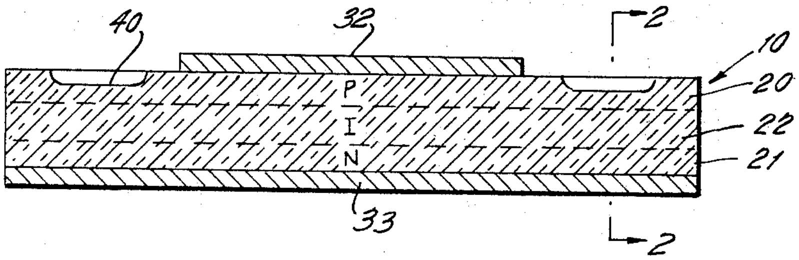
FIGURE 1 is a cross-sectional diagram of a typical semiconductor wafer which incorporates a novel groove therein in accordance with the invention.

Referring first to FIGURE 1, I have illustrated therein a typical semiconductor rectifier element which includes a silicon wafer 10 which may be prepared in the usual and well known manner. Thus, the wafer 10 which may have a thickness of the order of 0.010 inch, and can have any desired surface configuration such as circular or square, has a P-type conductivity region 20 formed in one surface thereof as by diffusion, and an N-type region 21 formed therein, again as by diffusion. The P-type region 20 is separated from the N-type region 21 by a region 22 which is of intrinsic conductivity.

Figure 2:
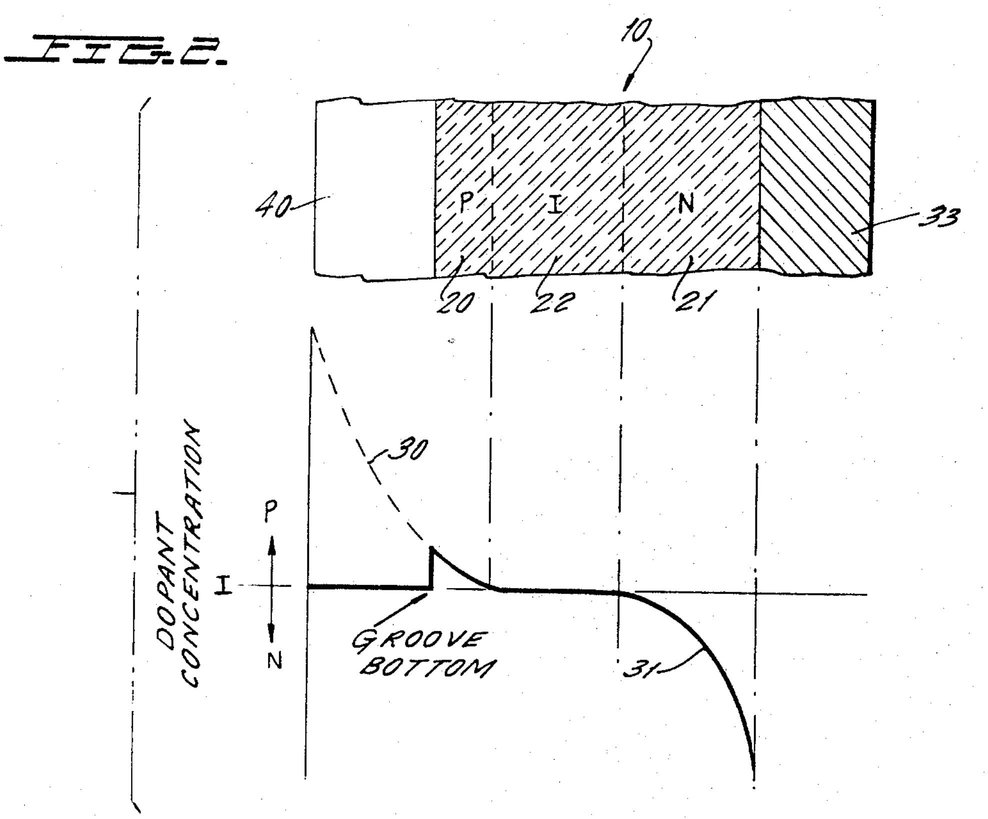
FIGURE 2 is a cross-sectional view of FIGURE 1 along the line 2—2 and shows the cross-section of the wafer at the groove portion in conjunction with a diagram illustrating dopant concentration along the thickness of the wafer at the groove portion.

The dopant concentration along the thickness of the wafer of FIGURE 1 changes in the manner generally illustrated in FIGURE 2 when considering the dotted line portion 30 along with the remainder of the curve 31. Thus, when going from the top of the wafer, the P-type conductivity concentration is at its highest, this concentration decreasing toward zero in the intrinsic layer 22, and then changing to an N-type concentration which continuously increases toward the outer surface of the wafer in N-type region 21. Suitable electrodes such as the anode electrode 32 and cathode electrode 33 are then connected to the upper and lower surfaces of the wafer in the usual manner.

In accordance with the present invention, a groove 40 is etched into the upper surface of the wafer 10 by any suitable etching technique to a depth just below the end of the P-type region 20 in order to segregate the periphery of the wafer from the anode 32.

In a typical device utilizing the groove of the invention, the N-type region will extend for approximately 0.003 inch, and similarly the P-type region will extend for 0.003 inch. The depth of the groove in this situation will extend for approximately 0.0025 inch, and will be located in the doping concentration curve of FIGURE 2 at approximately the point indicated as groove bottom. Thus, the groove has a depth from the surface of the wafer to a point just prior to the beginning of the intrinsic-type conductivity material within the wafer.

In operation of the device, the groove 40 will electrically separate the outer rim portion of the wafer from the anode 32 since the lateral conductivity of the silicon material will be very poor in the lightly doped region below the bottom of the groove 40.

Therefore, when the device is used in a high voltage application and the anode is made strongly positive, the outer rim cannot charge up to this high potential, since substantially the entire potential difference will appear along the bottom of the flat groove 40. Note that groove 40 will have a radial width which could be of the order of 0.04 inch in length (approximately 4 times the thickness of the wafer) in the particular embodiment of the invention.

Thus, the entire potential difference can appear along the bottom of the flat groove with the electrical gradient along the bottom of the groove being relatively low because of the long radial dimension of the groove. The electrical gradient on the outer rim will now also be very low, since the voltage will not reach out to this remote lateral position.

While the foregoing describes the invention for the case of a diode or a device having a single junction therein, it will be apparent that the invention is equally applicable to multi-junction devices such as thyristors.

Figure 3:
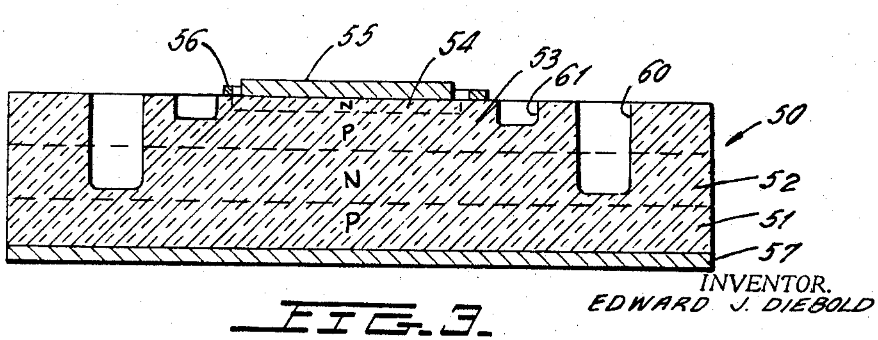
FIGURE 3 illustrates the manner in which the invention may be applied to a multi-junction device such as a thyristor.

FIGURE 3 illustrates the manner in which the invention can be applied to a thyristor which is comprised of a wafer of silicon material 50 which has successive alternate conductivity types including P-type layer 51, N-type layer 52, P-type layer 53 and N-type layer 54. A cathode electrode 55 is then attached to the N-type layer 54, while a gate electrode 56, which may be ring-shaped, is attached to P-type layer 53. An anode electrode 57 is then secured to the bottom P-type layer 51.

Typically, layers 51, 52 and 53 are each 0.004 inch thick; groove 60 is 0.03 inch wide; the distance from the interior of groove 61 to the interior of groove 60 is 0.03 inch; and groove 61 has a width of about 0.02 inch.

Thus, groove 60 segregates the interior portion of N-type region 52 from the exterior portion thereof so that a high voltage will not appear at the outer rim of N-type region 52.

In a similar manner, an interior groove 61 is provided to isolate anode 55 from the interior rim section of P-type layer 53. Clearly, voltage gradient limitations will operate in the thyristor of FIGURE 3 in a manner identical to that described for FIGURE 1, whereupon the thyristor of FIGURE 3 can be applied to extremely high voltage application without being limited by rim breakdown.

Although this invention has been described with respect to its preferred embodiment, it should be understood that many variations and modifications will now be obvious to those skilled in the art, and it is preferred, therefore, that the scope of the invention be limited not by the specific disclosure herein, but only by the appended claims.

The embodiments of the invention in which an exclusive privilege or property is claimed are defined as follows:

1. A high voltage semiconductor device comprising a wafer of semiconductor material having an upper and lower surface; a variable concentration of doping agents distributed across the thickness of said wafer generally defining an upper, generally P-type region, and a lower, generally N-type region; said P-type region extending from said upper surface of said wafer toward the center of said wafer with a gradually decreasing concentration of P-type dopants; said N-type region extending from said lower surface toward the center of said wafer with a gradually decreasing concentration of N-type dopants; an annular depression extending about the periphery of said upper surface and spaced from the edge of said upper surface thereby to isolate the rim of said wafer from central regions of said upper surface; said depression having a depth defined by the depth at which the concentration of said P-type dopants is almost zero and said depression having a radial width of approximately five to ten times its depth; and a first and second electrode; said first electrode connected to said upper surface interiorly of said depression; said second electrode connected to said lower surface.

2. The device as set forth in claim 1 wherein said depression has a generally flat bottom surface lying in a plane immediately above the plane at which said P-type dopant concentration becomes zero.

3. The device as set forth in claim 1 wherein said generally P-type and N-type regions are separated by a central intrinsic conductivity region.

4. The device as set forth in claim 3 wherein the thicknesses of said P-type, N-type, and intrinsic regions are approximately equal.

5. The device as set forth in claim 4 wherein said P-type region has a thickness of approximately 0.0025 inch; said depression having a depth less than 0.0025 inch and greater than approximately 0.0020 inch.

6. The device as set forth in claim 4 wherein said depression has a generally flat bottom surface lying in a plane immediately above the plane at which said P-type dopant concentration becomes zero.

7. A semiconductor device comprising a semiconductor wafer having upper and lower surfaces having at least first and upper and second and lower spaced junctions therein parallel to said upper and lower surfaces; first and second spaced concentric notches extending around the periphery of said upper surface of said wafer; said first notch having a depth extending just short of said first junction; said second notch extending through said first junction to a depth just short of said second junction and the widths of said first and second notches each being of the order of five to ten times the distances between said upper surface and first junction and between said first and second junctions.

8. The device as set forth in claim 7 wherein said first and second notches have generally flat bottom surfaces lying in a plane parallel to the planes of said upper and lower surfaces.

References Cited

UNITED STATES PATENTS 2,964,648 12/1960 Doucette et al. ______ 317—235

JOHN W. HUCKERT, *Primary Examiner.*

J. D. CRAIG, *Assistant Examiner.*